United States Patent [19]

Leroux et al.

[11] Patent Number: 4,739,267

[45] Date of Patent: Apr. 19, 1988

[54] METHOD FOR CALIBRATING THE AMPLITUDE OF RADIOFREQUENCY EXCITATION OF A NUCLEAR MAGNETIC RESONANCE IMAGING APPARATUS

[75] Inventors: Patrick Leroux, Paris; Alain Marilier, Bourg la Reine, both of France

[73] Assignee: Thomson-CGR, Paris, France

[21] Appl. No.: 45,543

[22] Filed: May 4, 1987

[30] Foreign Application Priority Data

May 6, 1986 [FR] France ................................ 86 06547

[51] Int. Cl.$^4$ ............................................. G01R 33/20
[52] U.S. Cl. ...................................... 324/314; 324/307
[58] Field of Search ............... 324/300, 307, 308, 309, 324/310, 311, 313, 314, 315; 128/653

[56] References Cited

U.S. PATENT DOCUMENTS

| | | | |
|---|---|---|---|
| 4,486,709 | 12/1984 | Bendall | 324/314 |
| 4,516,582 | 5/1985 | Redington | 324/309 |
| 4,532,473 | 7/1985 | Wehrli | 324/309 |
| 4,549,139 | 10/1985 | MacFall | 324/309 |
| 4,563,647 | 1/1986 | Young | 324/309 |

FOREIGN PATENT DOCUMENTS 0109238 5/1984 European Pat. Off. .
0152879 8/1985 European Pat. Off. .

*Primary Examiner*—Michael J. Tokar
*Attorney, Agent, or Firm*—Oblon, Fisher, Spivak, McClelland & Maier

[57] ABSTRACT

Calibration of radiofrequency excitation involves application of two successive pulses of identical waveform and amplitude. The excitations are applied in series of excitations of variable amplitude from one excitation to the next in order to determine the calibrated value of the excitation pulses to be employed by transition of the amplitude of the received signal through a minimum value. It is demonstrated that this procedure prevents the calibration from being impaired by inhomogeneities of the orienting field of the apparatus. Spatial and spectral inhomogeneities of the excitation are also eliminated by applying throughout the calibration a selection gradient to the body under examination. Defects are eliminated by frequency filtering of the detected signal.

9 Claims, 2 Drawing Sheets

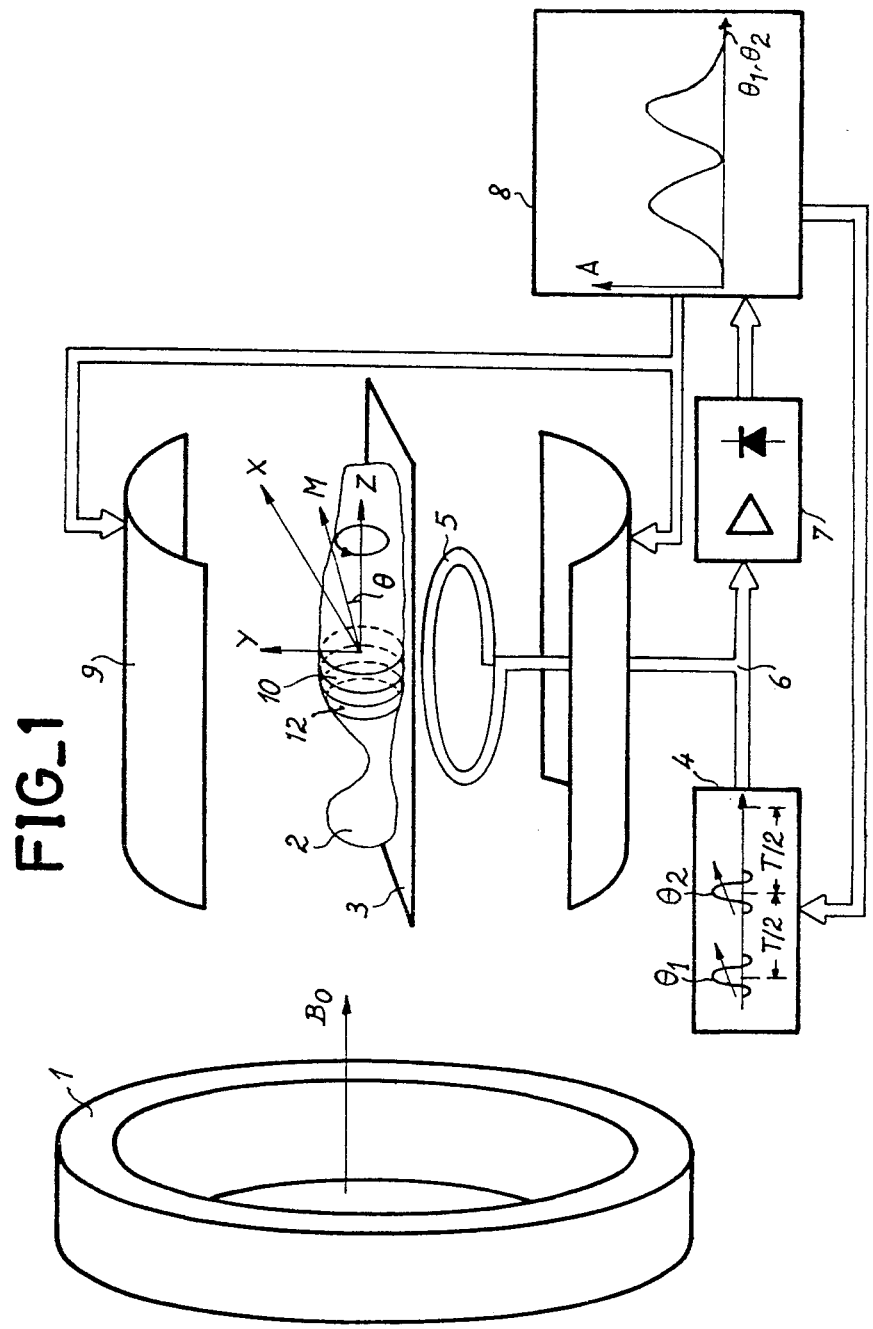
FIG_1

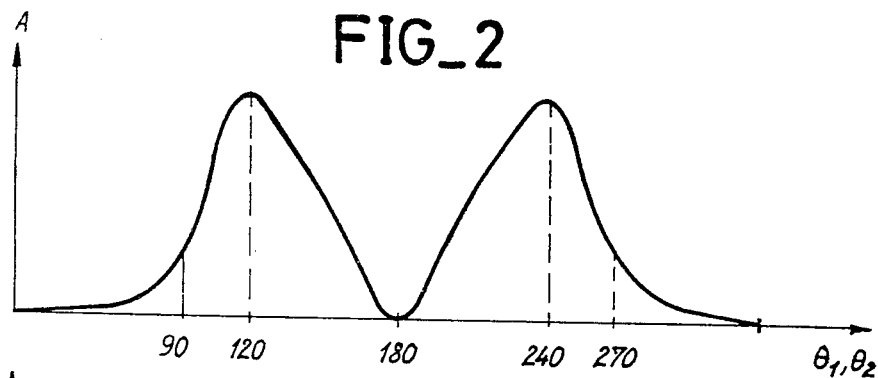
FIG_2
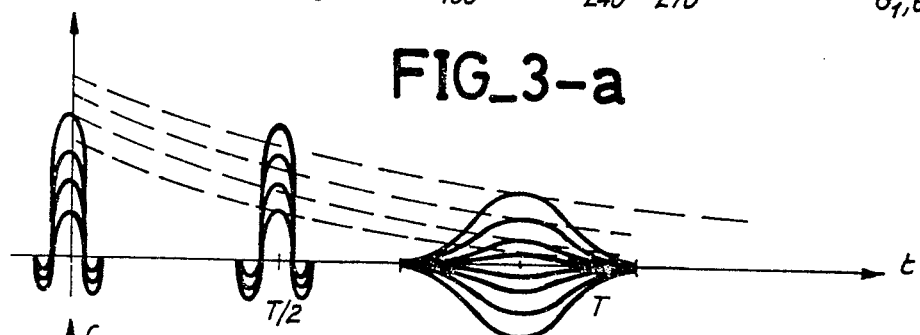
FIG_3-a
FIG_3-b
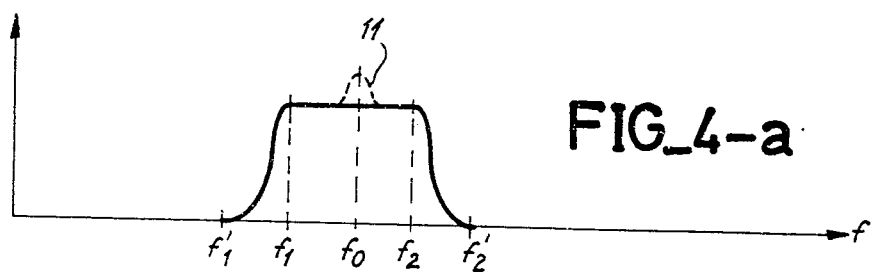
FIG_4-a
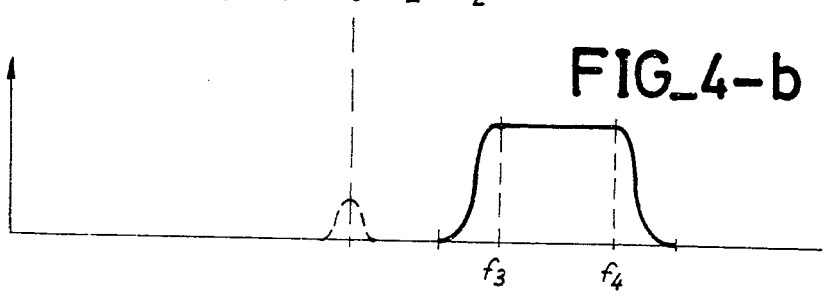
FIG_4-b

METHOD FOR CALIBRATING THE AMPLITUDE OF RADIOFREQUENCY EXCITATION OF A NUCLEAR MAGNETIC RESONANCE IMAGING APPARATUS

BACKGROUND OF THE INVENTION

1. Field of the Invention

The present invention relates to a method for calibrating the amplitude of radiofrequency excitation of an apparatus for imaging by nuclear magnetic resonance (NMR). The invention is primarily applicable to the medical field in which imaging devices of this type are used in diagnostic techniques, in particular for detection of cancers. The invention nevertheless finds potential applications in other fields, especially in the scientific field in which devices based on similar design principles can be employed.

2. Description of the Prior Art

An NMR device essentially includes a magnet for producing a steady and uniform high-strength magnetic field ($B_0$) or so-called orienting field within an enclosure of interest. A body to be examined is placed within said enclosure and is subjected to a radiofrequency excitation of short duration. As soon as the excitation is discontinued, the magnetic moments of the body particles which have been tilted under the action of this excitation have a tendency to realign themselves with the orienting field. In the course of realignment, said magnetic moments restore the energy collected during excitation in the form of an electromagnetic signal which is detected. Processing of this signal provides information relating to the intimate nature of the body under examination. In methods which make use of imaging stages, NMR machines are also provided with so-called gradient coils which are capable of producing orienting-field supplements, the distribution of which varies according to the coordinates of the points of application. Field gradients applied during the excitation stage as well as or alternatively prior to and/or during reception of the NMR signal accordingly make it possible to code the space. Suitable filtering then makes it possible to extract from the detected signal items of information relating to the nature of the body in selected cross-sections or "slices", images of which can be produced.

The quality of the signal received after excitation is essentially dependent on the efficiency of this excitation. In very general terms, it may be stated that the magnetic moments of the particles are tilted through an angle of 90° in the most favorable cases with respect to the orientation of the orienting field. Said magnetic moments return into alignment with this orientation by precessing. In principle, the means adopted for detecting the precession signal include a coil, the turns of which are located in a plane parallel to the orientation of the field. If the excitation is too weak, the angle of tilt is smaller than 90°. If, on the contrary, the excitation is too strong, the angle of tilt is larger than 90°. In both cases the signal measured at the terminals of the coil is attenuated. The signal-to-noise ratio is less satisfactory in this case. If $\theta$ denotes the angle of tilt, it may even be positively stated that the amplitude of the detected signal is proportional to $\sin\theta$. Hence it is an advantage to make $\theta$ equal to 90°.

In actual practice, bodies do not all exhibit the same electromagnetic impedance with respect to the excitation. A fact that can be understood intuitively and has been verified by experience is that bodies of large bulk require a larger amount of energy than small bodies in order to be suitably excited. In the medical field, the medical excitation applicable to a large-bodied patient has to be of considerably higher value than the excitation applicable to a small-bodied patient such as a child, for example. Before beginning all the operations involved in production of the requisite images, it is consequently necessary to carry out an excitation calibration operation. Classically, it is a known practice to subject the body under examination to a series of radiofrequency excitation pulses, the amplitude of which varies from one pulse to the next. The free precession signal (FID) is then measured after each pulse and it is possible to determine the value of excitation at which this signal has passed through a maximum. This excitation value corresponds to the 90° excitation which it is sought to obtain. This method is subject, however, to many drawbacks.

In particular, although acquisition of a free precession signal is particularly simple, it is nevertheless attended by disadvantages. In the first place, this signal is very rapidly evanescent and in addition fails at the moment of measurement to take into account the true value of the signal emitted by the particles by reason of the inhomogeneities of the orienting field. This results in a relative displacement between the true value and the value thus deduced from the 90° excitation. Furthermore, this relative displacement also takes into account the homogeneity of the excitation itself. Finally, the aforementioned calibration entails determination of the 90° pulses. However, the rapid evanescence of the free precession signal in time makes it necessary to measure this signal by means of the so-called spin-echo technique in the case of experimentations followed by production of images. In this technique, the excitation involves a 180° excitation pulse which follows in time the 90° excitation pulse. Regardless of the care devoted to the construction of amplifiers which multiply by two and have the function of converting a 90° pulse to a 180° pulse, the frequency spectrum of these pulses cannot readily be adjusted. It is in fact known that the frequency spectrum of the 180° pulse must be of greater width than the 90° pulse. The 180° pulse is therefore of shorter duration than the 90° pulse (in addition to the fact that its amplitude is double). The correspondence between these different spectra is complex and makes it impossible to perform rapid computation of doubling of the excitation energy.

Experience shows in addition that the influence of the spectral composition of the 180° pulse is predominant in the quality of images formed with such pulses. In particular, faulty calibration of a first 180° pulse results in an artifact in the form of a dotted line at the center of the image. A known expedient for overcoming this difficulty consists in carrying out a double acquisition of the data relating to each image. By combining two acquisitions, this defect can be eliminated but only at the cost of doubling of the time of acquisition of each image. A defect in the calibration of this first 180° pulse also results especially in a strong artifact on the second-echo image in the form of a parasitic image which is symmetrical with the real object about one of tne axes. Similarly, faulty calibration of a second 180° pulse produces a symmetrical ghost image of the object at the time of the third echo. Defects arising from poor calibration of 180° pulses may be removed under certain conditions.

To this end, it is possible to produce a modification of the coding by the field gradients at the time of application of these echo pulses. In particular, all the odd-numbered 180° pulses (1, 3, . . .) are applied in the presence of so-called selection gradients, the duration of which is substantially one-half the time interval during which the even-numbered 180° pulses (2, 4, . . .) are applied. This method has the disadvantage, however, of increasing the duration of the selection gradient and therefore of producing a corresponding reduction of the signal measurement time during the sequence considered.

SUMMARY OF THE INVENTION

The invention proposes to overcome the disadvantages mentioned in the foregoing by making an appreciable improvement in the quality of calibration. This result is essentially achieved by calibrating in the presence of a second pulse which performs the function of the 180° pulse. The expected advantage consists in making less critical the use of artifact removal procedures which are exacting and complicated. In accordance with the invention, the calibration involves in particular an excitation applied in the form of two pulses which are successive in time. The first pulse is intended to tilt the magnetic moments of the particles whilst the second pulse has the intended function of producing reflection of the dispersion of magnetic moments which arises from inhomogeneities of the orienting field. In the series of calibration excitations, either or both of these pulses may vary from one excitation to another. The measured signal which serves to determine the calibration amplitude is detected at the end of a time interval which has elapsed from the first pulse and which is equal to double the time interval between the two pulses.

In a preferred embodiment, the two pulses are identical with each other both in shape and in amplitude, at each excitation. An improvement of the invention consists in applying these pulses in the presence of a so-called selection gradient which is conducive to removal of spatial inhomogeneities from the excitation pulses. Finally, in order to remove from the received signal contributions corresponding to transitional spectral bands of the frequency spectrum of the excitation pulse, it is recommended to carry out the detection in the presence of a field gradient which is identical with the field gradient applied during the selection. It will be shown that the contributions of these transitional bands are eliminated by suitable filtering. By means of the general procedure established by the present invention, calibration of the amplitude of radiofrequency excitation can accordingly be achieved with a higher degree of efficiency.

The invention relates to a method for calibrating the amplitude of radiofrequency excitation of an NMR imaging apparatus provided in particular with means for producing an orienting magnetic field. In this method, a body to be examined and placed within the apparatus is subjected to a series of radiofrequency excitations, the return signal emitted by the body when said excitation is discontinued being measured after each excitation. The distinctive character of the invention lies in the fact that each radiofrequency excitation involves application of two successive radiofrequency pulses at separate instants in time in order to exclude inhomogeneities of the orienting field from measurement of the signal emitted by the particles.

BRIEF DESCRIPTION OF THE DRAWINGS

FIG. 1 illustrates a device for the practical application of the method in accordance with the invention.

FIG. 2 is a diagram showing the variation of the detected signal in a particular alternative mode of excitation in accordance with the invention, when the amplitude of the excitation varies.

FIGS. 3a and 3b are waveform diagrams of excitation signals and of field-gradient signals which are necessary for selection of cross-sections to be examined.

FIGS. 4a and 4b are diagrams of frequency spectra of signals detected according to the position of the body cross-section under examination.

DESCRIPTION OF THE PREFERRED EMBODIMENTS

FIG. 1 illustrates a device for the practical application of the method in accordance with the invention. This device includes a first element 1 for producing an orienting field $B_O$ in which a human body 2 is placed while resting for example on a platform 3. A generator 4 applies a radiofrequency excitation to the body 3 by means of an antenna 5. Under the action of this excitation, the magnetic moments M of the particles of the body 2 tilt through an angle $\theta$. As soon as the excitation is discontinued, the magnetic moments precess so as to realign themselves with the orientation $B_O$ (axis Z). This movement of precession gives rise to an electromagnetic resonance signal which is detected by the antenna 5. This signal is directed to a receiver 7 by means of a duplexer 6. The receiver 7 also serves to process the detected signal. In particular, this signal can be detected and then processed quadratically in order to measure its effective amplitude. This amplitude is then transmitted to a control circuit 8 which controls the entire device. Quadratic processing makes it possible in addition to overcome the disadvantages relating to lack of accuracy of phase-locking of a signal for demodulating the received signal.

During the calibration stage, the control circuit 8 produces a variation in amplitude of the excitation produced each time by the generator 4. The control circuit 8 may be provided in addition with a computer for plotting the curve of amplitude of the detected signal as a function of the amplitude of the applied excitation. In accordance with the invention, the excitation applied by the generator 4 is not limited to a single pulse but consists on the contrary of two pulses $\theta_1$ and $\theta_2$ separated from each other by a time interval T/2. The detected signal is measured at each experimentation at the end of a period equal to T after application of the first of these two pulses. Preferably, the time duration T or T/2 is such that particles placed in a field $B_O$ at limits of its tolerance are phase-shifted with respect to each other by at least 360° at the moment of measurement (T).

It is known that a pulse has the effect of tilting the magnetic moment of the particles under examination through an angle $\theta$ which is dependent on the value of its amplitude. If $\theta_1$ denotes the angle at which the first pulse causes tilting of the magnetic moments and $\theta_2$ denotes the same angle relative to the second pulse, it may be written that the amplitude A of the signal quadratically detected by the receiver 7 is proportional to:

$$A = \sin^2(\theta_2/2) \sin \theta_1$$

In accordance with the invention, it is proposed to vary either the amplitude of the first pulse alone ($\theta_1$) or the amplitude of the second pulse alone ($\theta_2$) or both amplitudes conjointly and simultaneously. When the amplitude of the first pulse alone varies, $\theta_2$ is constant. The value chosen for $\theta_2$ is an intermediate value (and even an unknown value). In consequence, the first term of the expression of A with a sine function having an exponent 2 is constant. The amplitude of the detected signal is then at a maximum value when $\theta_1$ has a value of 90°. In contrast, if $\theta_1$ is constant and chosen at an intermediate value (and even an unknown value), the amplitude of the detected signal has a maximum value when $\theta_2$ has a value of 180°. In the first case as in the second, it cannot rightly be claimed that a true spin echo phenomenon is exhibited at the moment of reception of the detected calibrated signal. In fact, the amplitude of the first pulse does not correspond to a tilt or angular displacement of 90° when the second pulse corresponds to a tilt or angular displacement of 180° and conversely. It is observed in either case, however, that the detected calibrated signal is no longer impaired by inhomogeneities of the orienting field and that its evanescent nature is no longer an obstacle to measurement of this signal.

Another solution consists in varying the two pulses of the radiofrequency excitation conjointly and in the same direction. The values chosen for their respective amplitudes can vary between the same value and twice the value. Experience has shown, however, that this type of excitation cannot readily be applied in practice for the reasons stated earlier. In order to ensure accurate discrimination of the amplitudes to be determined, it is found preferable in the present invention to apply two pulses of identical waveform and amplitude. And since the 180° pulse has the largest waveform (spectrum), both pulses accordingly have this spectrum. The value of the 90° pulse is subsequently deduced therefrom. Imprecisions related to the complexity of this deduction are less critical in this case by reason of the less critical nature of the 90° pulse. It is demonstrated under these conditions, where $\theta_1$ is equal to $\theta_2$, that the amplitude of the detected signal may be written as follows:

$$A = 2\sin^3 \theta/2 \cos \theta/2 \text{ if } \theta_1 = \theta_2 = \theta.$$

The advantage of this expression accordingly lies in the fact that A has a value of when $\theta$ has a value of 180°. Determination of a value by zero transition of a detected signal is physically more straightforward and more accurate. From a practical standpoint in this particular case, the waveform of the quadratically detected signal A is of the type shown in FIG. 2. The signal passes through a peak value when these pulses each correspond to an angular shift of the magnetic moments through approximately 120°. Said signal passes through a minimum value when each pulse corresponds to a pulse having an angular shift of 180°. FIG. 3a shows the variation in amplitudes of the excitation pulses at t=0 and t=T/2 and the variation in amplitude of the detected signal about t=T. From one experiment to another, for example, the amplitudes of the pulses increase whereas the amplitude of the detected signal decreases conjointly.

It has been observed that, during the calibration stage, patients may occasionally be placed on the platform 3 without taking precautionary steps. For example, the arms of a patient may be very close to the antenna 5 or the hands may even touch the antenna. This gives rise to induced inhomogeneity in the spatial distribution of the radiofrequency excitation. This inhomogeneity has a repercussion on measurement of the calibration signal and results in impairment of this latter. In order to avoid inhomogeneities in distribution of the radiofrequency excitation, it is proposed in the present invention to carry out this calibration on a particular section or "slice" 10 of the body 2 at a location in which it is known that spatial homogeneity of excitation is definitely established. The procedure adopted by way of example will be apparent from FIG. 1. Field gradient coils 9 serve to determine particular conditions of magnetic polarization of the body 2 such that the resonance phenomenon is permitted to arise at each excitation only in a thin slice 10 of said body. The field-gradient coils 9 which are controlled by the sequencer 8 in fact apply a magnetic-field supplement within the slice 10 and modify the resonance frequency in this region. By adapting the frequency spectrum of the excitation to this resonance frequency, the slice 10 in the body 2 is selected for the resonance phenomenon. FIG. 3b shows the time-waveform diagram of application of a field gradient $G_z$ simultaneously with the application of the excitation (with its two pulses). By proceeding in this manner, any defects in spatial distribution of the excitation are eliminated. By way of alternative, the selection gradient may be interrupted between the two excitation pulses.

FIG. 4a is a spectral diagram of the excitation pulses. The diagram has a passband $f_1-f_2$ corresponding to the geometrical width of the slice 10 within the body 2. In actual fact, the orienting-field supplement provided by the gradients cannot in practice be applied abruptly at certain locations and not at all at other locations. Said field supplement is applied progressively and linearly as a function of the abscissa of the slice as measured along an axis (in this case the axis Z). The conditions of resonance are consequently not the same in frequency from the beginning to the end of the slice 10. This justifies the passband width of the excitation pulses. However, a precise definition of a slice is not possible by reason of the fact that the passband of the spectrum of the excitation pulses is always adjacent to transition bands $f'_1-f_1$ and $f_2-f'_2$. The lateral portions of the slice which receives excitations with attenuated amplitudes corresponding to these transition bands are therefore not correctly excited and fail to undergo a 180° angular shift twice in succession at the moment when $\theta_1=\theta_2=180°$. In consequence, the particles located in the edges of the slice in this case produce a signal which perturbs the existence of the minimum shown in FIG. 2. Accuracy of determination of this minimum is accordingly impaired.

It is accordingly proposed in the present invention to receive the particle equilibrium return signal in the presence of a gradient which produces a frequency partition along the same axis (Z) as the axis employed for selection of the slice 10. Under these conditions, in the received signal, the different portions of the slice 10 including the edges take part in the signal by contributing different frequency components. It is recalled that, in the absence of this "read" gradient, all the magnetic moments of the slice precess at a single frequency which depends solely on the orienting field $B_O$. Rather than choosing another value for this gradient applied during the reading operation, a more simple procedure from a practical standpoint is to maintain the selection gradient until the end of this reading operation. In consequence, the selection gradient applied from $t_1$ to $t_2$ for the purpose of eliminating inhomogeneities in the spatial distribution of the excitation is now maintained up to a date $t_3$ which is subsequent to the end of readout so as to produce frequency modulation of the measured signal (FIG. 3b). It is then only necessary to filter the measured signal with a filter having a passband of smaller width within the interval $f_1$-$f_2$ in order to remove from the received signal the components which are representative of the non-calibrated transition of the edges of the slice 10.

In practice, it is known in particular with methods of multiple-section imaging, to excite slices 10 which are adjacent to each other within the body 2 by applying the same selection gradient but by displacing the excitation passband. This displacement in excitation frequency is usually obtained by employing an oscillator having a fixed frequency $f_O$ which modulates a signal whose spectrum is between $f_1$-$f_O$ and $f_2$-$f_O$. Unfortunately, with this technique, the spectrum of the excitation signal is not strictly flat within the useful band $f_1$-$f_2$. In fact, this signal spectrum has an amplitude peak 11 at $f_0$ which it is difficult to eliminate (see FIG. 4a). In accordance with the invention, consideration is therefore given to the need to provide enhanced calibration by avoiding this defect. This objective is achieved by displacing the slice under examination. This virtually consists in displacing the excitation frequency in such a manner as to ensure that, by reason of the presence of the supplementary field gradient, the resonance frequency which arises from this gradient is located within a frequency band $f_3$-$f_4$ which is outside the band $f_1$-$f_2$. Under these conditions, filtering of the signal received within this band $f_3$-$f_4$ does not have any component which is representative of magnetic moments which would have rotated at the moment of calibration through more than 180° as a result of the presence of the overoscillation 11 within the spectrum $f_1$-$f_2$.

What is claimed is:

1. A method for calibrating the amplitude of radiofrequency excitation of an NMR imaging apparatus provided in particular with means for producing an orienting magnetic field, in which a body to be examined and placed within the apparatus is subjected to a series of radiofrequency excitations of variable amplitude from one excitation to the next, the return signal emitted by the body when said excitation is discontinued being measured after each excitation, wherein each radiofrequency excitation involves application of two successive radiofrequency pulses at separate instants in time in order to exclude inhomogeneities of the orienting field from measurement of the signal emitted by the particles.

2. A method according to claim 1, wherein the waveforms and amplitudes of both pulses of each excitation are identical from one pulse to the next and wherein said amplitudes vary in the same manner from one excitation to the next in the series.

3. A method according to claim 2, wherein the excitation is applied in the presence of a supplementary orienting field or so-called field gradient having a value dependent on an abscissa measured along an axis which is oriented in a given direction with respect to the body in order to perform a selection of cross-section at the time of excitation and thus to reduce defects in spatial homogeneity of the radiofrequency excitation.

4. A method according to claim 3, wherein measurement of the signal emitted by the particles is performed in the presence of the supplementary orienting field which is present during excitation and wherein the signal emitted by the particles is filtered in frequency in order to eliminate contributions which depend on sidebands of the excitation spectrum.

5. A method according to claim 4, wherein the field gradient has an antisymmetric shape with respect to a given abscissa within the body and wherein the excitation frequency which is equal to the center frequency of the filter is displaced with respect to a nuclear magnetic resonance frequency corresponding to the body location at which said supplementary field gradient is zero.

6. A method according to claim 4 or claim 5, wherein the supplementary field is maintained from the beginning of the excitation to the end of the measurement.

7. A method according to claim 2, wherein the waveform of the pulses corresponds to the waveform of a 180° pulse.

8. A method according to claim 1, wherein the time interval which elapses between the two pulses is sufficient to ensure that the inhomogeneities of the orienting field produced by the apparatus induce a phase shift at least equal to 360° between the signals emitted by particles at locations in which the field is at its tolerance limits.

9. A method according to claim 1, wherein measurement of the emitted signal involves quadratic processing of said signal in order to eliminate imprecisions in phase-locking of a demodulation signal.

* * * * *